United States Patent
Hatanaka et al.

(10) Patent No.: US 9,564,768 B2
(45) Date of Patent: Feb. 7, 2017

(54) DISCHARGE DEVICE FOR ELECTRICITY STORAGE DEVICE

(75) Inventors: Keita Hatanaka, Tokyo (JP); Sho Shiraga, Tokyo (JP); Toshihiro Wada, Tokyo (JP); Shoji Yoshioka, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 327 days.

(21) Appl. No.: 14/390,057

(22) PCT Filed: Apr. 12, 2012

(86) PCT No.: PCT/JP2012/059994
§ 371 (c)(1),
(2), (4) Date: Oct. 2, 2014

(87) PCT Pub. No.: WO2013/153650
PCT Pub. Date: Oct. 17, 2013

(65) Prior Publication Data
US 2015/0061601 A1 Mar. 5, 2015

(51) Int. Cl.
*H02J 7/00* (2006.01)
*H01M 10/44* (2006.01)
(Continued)

(52) U.S. Cl.
CPC ........... *H02J 7/007* (2013.01); *G01R 31/3606* (2013.01); *H01M 10/44* (2013.01); *H01M 10/48* (2013.01);
(Continued)

(58) Field of Classification Search
USPC ....... 320/116, 118, 122, 125, 132, 134, 107, 320/164; 324/434, 429, 433, 427
See application file for complete search history.

(56) References Cited

U.S. PATENT DOCUMENTS 5,578,914 A * 11/1996 Morita .................. H01M 10/44
320/122
5,998,973 A 12/1999 Tsai
(Continued)

FOREIGN PATENT DOCUMENTS

CN 1776445 A 5/2006
EP 2 249 453 A1 11/2010
(Continued)

OTHER PUBLICATIONS

Office Action (First) issued on Dec. 28, 2015, by the Chinese Patent Office in corresponding Chinese Patent Application No. 2012800722967 and an English translation thereof. (9 pgs).
(Continued)

*Primary Examiner* — Alexis A Boateng
(74) *Attorney, Agent, or Firm* — Buchanan Ingersoll & Rooney PC (57) ABSTRACT

A battery-condition monitoring device that monitors a condition of the battery through discharge thereof includes a discharger and a discharge control device. The discharger includes a discharge circuit having a load resistor and a switching element connected in series between a positive electrode of the battery and a negative electrode thereof. The discharge control device controls an open/close operation of the switching element. The discharge control device adjusts the resistance value of the load resistor in the discharger, thereby enabling an adjustment of a discharge current.

6 Claims, 5 Drawing Sheets

(51) Int. Cl.
*H01M 10/48* (2006.01)
*G01R 31/36* (2006.01)
*H01M 10/42* (2006.01)

(52) U.S. Cl.
CPC ............ *H02J 7/0016* (2013.01); *H02J 7/0063* (2013.01); *H01M 2010/4271* (2013.01); *H02J 2007/005* (2013.01)

(56) References Cited

U.S. PATENT DOCUMENTS

| | | | |
|---|---|---|---|
| 8,294,428 B2 | 10/2012 | Kakiuchi | |
| 2010/0244847 A1* | 9/2010 | Kudo | B60L 3/0046 324/433 |
| 2010/0253287 A1 | 10/2010 | Kim et al. | |
| 2011/0109269 A1* | 5/2011 | Li | H02J 7/0016 320/116 |
| 2011/0140665 A1 | 6/2011 | Tamezane et al. | |
| 2011/0313613 A1* | 12/2011 | Kawahara | H01M 10/441 701/34.4 |
| 2012/0025769 A1* | 2/2012 | Kikuchi | B60L 3/0046 320/118 |

FOREIGN PATENT DOCUMENTS

| | | |
|---|---|---|
| EP | 2 337 182 A2 | 6/2011 |
| JP | 2003-189490 A | 7/2003 |
| JP | 3543662 B2 | 7/2004 |
| JP | 2006-32184 A | 2/2006 |
| JP | 2007-17357 A | 1/2007 |
| JP | 2008-30618 A | 12/2008 |
| JP | 2010-203790 A | 9/2010 |
| WO | 00/04620 A2 | 1/2000 |

OTHER PUBLICATIONS

The extended European Search Report issued on Nov. 19, 2015, in corresponding European Patent Office Application No. 12874153.5-1804. (6 pgs).

International Search Report (PCT/ISA/210) mailed on May 15, 2012, by the Japanese Patent Office as the International Searching Authority for International Application No. PCT/JP2012/059994.

Written Opinion (PCT/ISA/237) mailed on May 15, 2012, by the Japanese Patent Office as the International Searching Authority for International Application No. PCT/JP2012/059994.

Notification of Reason for Rejection From the Japan Patent Office in Japanese Application No. 2012-543060 with English translation (5 pages).

Korean Office Action dated Feb. 29, 2016 issued in corresponding Korean Patent Appln. No. 10-2014-7027800, with English-language translation (7 pages).

* cited by examiner

DISCHARGE DEVICE FOR ELECTRICITY STORAGE DEVICE

TECHNICAL FIELD

The present disclosure relates to a discharge device for an electricity storage device.

BACKGROUND ART

It is difficult to directly measure the charging level (SOC; State Of Charge) of an electricity storage device, that is, the available battery capacity. However, it is known that there is some amount of correlation between the SOC of the electricity storage device and an open voltage (open-circuit voltage). Hence, conventional technologies obtain an open voltage through a measurement and a calculation, and obtain the SOC based on the correlation between the open voltage (internal voltage) and the SOC.

When the open voltage is E, and the voltage and current of the electricity storage device are V and I, the following formula (1) can be obtained.

$$E = V + I \cdot r \quad (1)$$

where r is an internal resistance of the electricity storage device. In the formula (1), for the internal resistance r, for example, a constant value (r0, a value when, for example, the SOC is 10% and a battery temperature is 20° C.) is applied.

However, the internal resistance r varies depending on the battery temperature and the SOC at any given point in time. Hence, a method of correcting the internal resistance r using the following formula (2) is disclosed (see, for example, Patent Literature 1).

$$r = r0 \cdot A2 \cdot A1 \quad (2)$$

where r0 is a predetermined resistance value given in advance for a battery. A1 is a first resistance ratio based on a battery temperature T. In addition, A2 is a second resistance ratio based on a predetermined reference charging level.

As is indicated above, it is apparent that there is a correlation between the SOC and the internal resistance. Hence, an available battery capacity detection device is disclosed that determines a deterioration level of a battery based on a resistance value dominated by internal mass transfer in the battery that is one of the internal resistances and has a high correlation with the available battery capacity (see, for example, Patent Literature 2). This available battery capacity detection device performs discharging with the battery being connected to a load resistor through a switch, and calculates a resistance value dominated by internal mass transfer in the battery based on a voltage across the terminals of the battery and a discharge current.

Conversely, a battery detection unit is disclosed that performs on/off switching at a predetermined frequency by a switch to discharge a battery that is connected to a load resistor, and that detects a voltage across the terminals and a current of a discharge circuit, thereby calculating the internal impedance of the battery (see, for example, Patent Literature 3).

Still further, an available capacity equalization device is disclosed that equalizes the variation in the SOC of electricity storage devices when multiple battery cells are connected in series and are loaded as a high-voltage battery (see, for example, Patent Literature 4). This available capacity equalization device sets, for each cell, a bypass circuit that includes a voltage sensor, a bypass resistor, and a bypass switch, and also controls this bypass switch.

More specifically, this available capacity equalization device causes a pre-installed load resistor to discharge to a target predetermined voltage at a timing for deactivating the operation of the battery storage device for a battery cell with a high voltage to equalize the voltages of the multiple connected batteries, for example. This causes the respective available capacities to be equalized among the battery cells.

The above-explained available battery capacity detection device, battery detection unit, and available capacity equalization device are all discharge devices that cause the electricity storage device to discharge to the load resistor in order to measure the condition of the battery, and to equalize the variation in the respective SOC of the electricity storage devices.

CITATION LIST

Patent Literature

Patent Literature 1: Japanese Patent No. 3543662
Patent Literature 2: Unexamined Japanese Patent Application Kokai Publication No. 2007-017357
Patent Literature 3: Unexamined Japanese Patent Application Kokai Publication No. 2006-032184
Patent Literature 4: Unexamined Japanese Patent Application Kokai Publication No. 2003-189490

SUMMARY OF INVENTION

Technical Problem

According to the discharge devices, such as the available battery capacity detection device, the battery detection unit, and the available capacity equalization device, the magnitude of the discharge current is limited by a predetermined load resistor value installed in the electricity storage device in advance. Due to such a limitation, measurement of the internal resistance of the electricity storage device under an optimized discharging condition becomes difficult.

A case in which a discharging condition is not optimized is a case in which sufficient polarization for measurement cannot be obtained in the electricity storage device. In order to let the electricity storage device obtain sufficient polarization for measurement, it is necessary to optimize the resistance value of a load resistor connected across both terminals of the battery in accordance with the designed value of the internal resistance of the electricity storage device in advance.

The internal resistance of the battery becomes high or low depending on a temperature environment and/or a history of usage. Hence, in the available battery capacity detection device of Patent Literature 2 and the battery detection unit of Patent Literature 3, even if the resistance value of the load resistor is set in accordance with the initial performance of the battery, an optimal resistance value shifts as the battery is used, and thus it becomes difficult to generate a sufficient discharging condition. Hence, it becomes difficult to measure the SOC and an internal impedance, and the like of the battery.

In addition, in the available capacity equalization device of Patent Literature 4, when the deactivation time of the electricity storage device is too short, or when the non-uniformity of the available capacities among the batteries is too great, it becomes difficult to perform sufficient discharging. This results in a difficulty of accomplishing the equalization of the available capacities.

The present disclosure has been made in view of the above-explained circumstances, and it is an objective of the present disclosure to provide a discharge device for an electricity storage device that can discharge a battery in accordance with the condition of the battery to measure the condition of the battery and to equalize cells.

Solution to Problem

To accomplish the above objective, a discharge device for an electricity storage device according to the present disclosure, by flowing a discharge current through a load resistor connected between a positive electrode of the electricity storage device and a negative electrode thereof, discharges the electricity storage device and measures a condition of the electricity storage device, and the discharge device includes: a discharger capable of switching a resistance value of the load resistor; and a controller that, based on a voltage of the electricity storage device, adjusts the discharge current by switching the resistance value of the load resistor; wherein the controller includes a voltage measurer that measures a voltage between the positive electrode of the electricity storage device and the negative electrode thereof, and based on the voltage measured by the voltage measurer, determines the resistance value of the load resistor and automatically performs switching such that a current flows such that a polarization value in a polarization curve of the electricity storage device becomes greater than a certain value.

Advantageous Effects of Invention

According to the present disclosure, the controller adjusts the resistance value of the load resistor in the discharge circuit. Accordingly, even if the resistance value of the internal resistance of the electricity storage device changes greatly, the deactivation time of the electricity storage device is too short, or the non-uniformity of the available capacities among batteries becomes too great, the resistance value of the load resistor can be changed in accordance with such a change. As a result, the battery can be discharged in accordance with the condition of the battery to measure the condition of the battery and to equalize cells.

DESCRIPTION OF EMBODIMENTS

Embodiments of the present disclosure will be explained in detail with reference to the accompanying drawings. The present disclosure should not be limited by the following embodiments.

Embodiment 1

A first embodiment of the present disclosure will now be explained.

Figure 1:
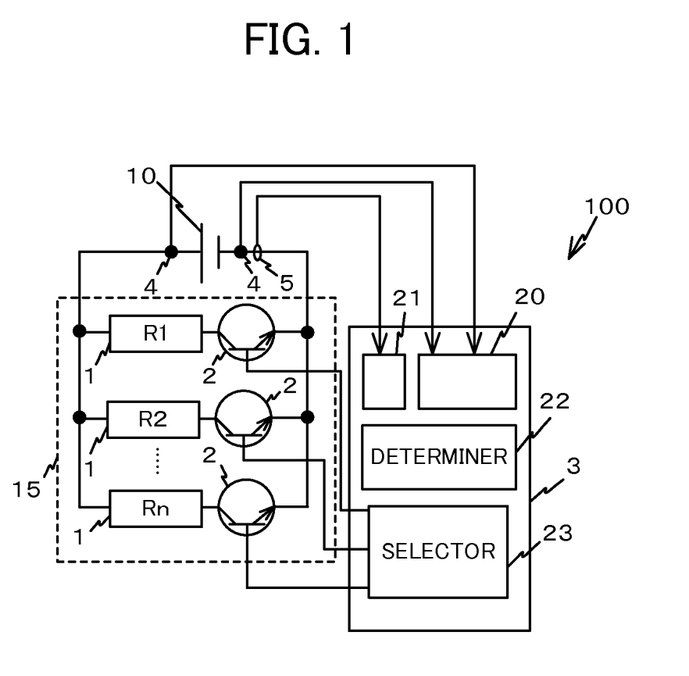
FIG. 1 is a circuit diagram illustrating a general structure of a discharge device for an electricity storage device (battery-condition monitoring device) according to a first embodiment of the present disclosure.

FIG. 1 illustrates a general structure of a battery-condition monitoring device 100 that is a discharge device for an electricity storage device according to the first embodiment of the present disclosure. As illustrated in FIG. 1, the battery-condition monitoring device 100 is a device that monitors a condition of a battery 10 that is the electricity storage device.

The battery 10 is a secondary battery (storage battery), and is, for example, a nickel-metal hydride battery, a lithium-ion battery, or the like.

The battery-condition monitoring device 100 discharges the battery 10, thereby monitoring the condition of the battery 10. Example conditions of the battery 10 are SOC, an internal impedance and the like.

As illustrated in FIG. 1, the battery-condition monitoring device 100 includes a discharger 15. First, an explanation will be given of the structure of the discharger 15.

The discharger 15 has both ends connected between a positive electrode of the battery 10 and a negative electrode thereof. The discharger 15 includes a discharge circuit in which a load resistor 1 and a switching element 2 are connected in series.

According to this embodiment, the discharger 15 includes the multiple discharge circuits. The respective discharge circuits are in parallel with each other.

Each load resistor 1 has one end connected to the positive electrode of the battery 10, and has the other end connected to the collector of the switching element 2. In each discharge circuit, the resistance value of the load resistor 1 is fixed. The respective load resistors 1 have difference resistance values, such as R1, R2, ... and Rn.

The switching element 2 is, for example, a transistor. The switching element 2 has the collector connected to the load resistor 1, and has the emitter connected to the battery 10. In addition, the gate electrode of the switching element 2 is connected to a discharge control device 3. The open/close operations of the switching element 2 are controlled by the discharge control device 3.

The positive electrode and negative electrode of the battery 10 are provided with respective terminals 4 for voltage measurement. In addition, the one end of the battery 10 is provided with an ammeter 5.

In addition, the battery-condition monitoring device 100 includes the discharge control device 3 that is a controller. An explanation will now be given of the structure of the discharge control device 3.

The discharge control device 3 includes a voltage measurer 20, a current measurer 21, a determiner 22, and a selector 23.

The voltage measurer 20 is connected with the two terminals 4. The voltage measurer 20 measures a voltage between the terminals 4, that is, a voltage between the positive electrode of the battery 10 and the negative electrode thereof (source voltage).

The current measurer 21 measures a current detected by the ammeter 5. That is, the current measurer 21 measures a current flowing from the battery 10.

The determiner 22 determines optimal resistance value of the load resistors 1 based on the voltage measured by the voltage measurer 20 and the current measured by the current measurer 21. More specifically, the determiner 22 determines a resistance value causing a necessary battery polarization for measurement in a discharging condition to be obtained.

An explanation will be given of how to determine the resistance value.

The determiner 22 determines a resistance value of the load resistors 1 that allows the current flowing through the battery 10 to satisfy a predetermined current condition. The predetermined current condition is, for example, a high current that allows the internal mass transfer resistance to be dominant in the internal resistance of the battery 10.

Figure 2:
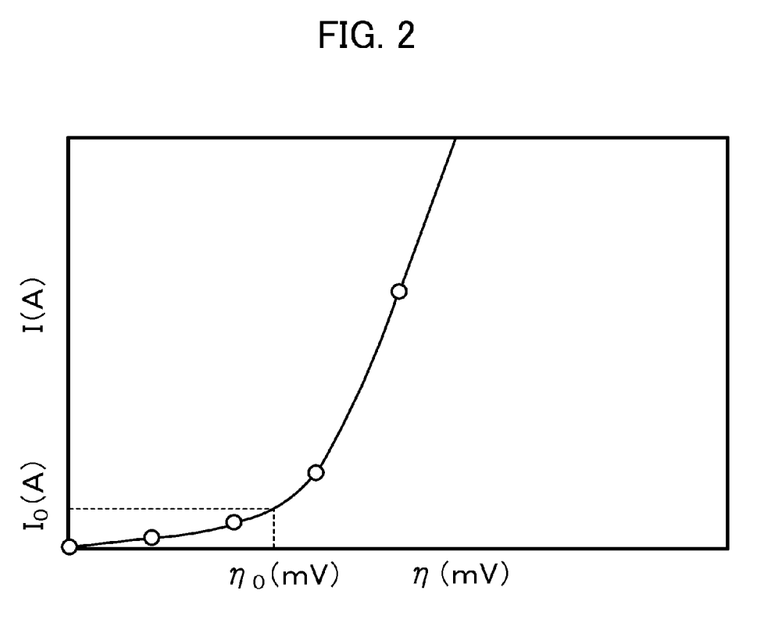
FIG. 2 is a graph illustrating an example polarization curve.

The current when the internal mass transfer resistance becomes dominant in the internal resistance of the battery 10 can be determined based on the polarization curve of the battery 10 to be measured as illustrated in FIG. 2. In FIG. 2, the vertical axis indicates a logarithm of the current (A), while the horizontal axis indicates a polarization (mV).

The polarization curve illustrated in FIG. 2 can be obtained when a lithium-ion battery is used as the battery 10, a tripolar battery for electrochemical measurement using the positive electrode (lithium cobalt oxide electrode) of the lithium-ion battery is prepared and is charged in accordance with the use range of a practical battery, and a polarization curve in the reducing direction of the positive electrode is measured by a generally used method.

As to the polarization curve, when a polarization value (polarization width) becomes greater, the current also becomes greater. When a polarization value $\eta$ becomes greater than a predetermined $\eta_0$, a relationship between the current and the polarization value becomes nonlinear. That is, in an area where the polarization width is greater than $\eta_0$, the internal resistance reaches a stage of depending on a so-called mass transfer rate.

Hence, according to this embodiment, based on the measured voltage across the terminals, the determiner 22 determines the resistance value of the load resistors 1 when the internal mass transfer is dominant so as to make the polarization value greater than $\eta_0$, that is, so as to allow a greater constant current than a current $i_0$ to flow to the battery 10.

The selector 23 controls the open/close operations of the multiple switching elements 2 based on the resistance value determined by the determiner 22. More specifically, the selector 23 controls the open/close operations of the respective switching elements 2 in such a way that the whole resistance value of the load resistors connected to the battery 10 becomes the determined resistance value. That is, the selector 23 can be a selector that selects the load resistor or resistors 1 to be actually utilized as the load resistor or resistors among the load resistors 1 having different resistance values. The multiple switching elements 2 may be closed to combine the multiple load resistors 1, and the determined resistance value may be obtained.

That is, the battery-condition monitoring device 100 controls the open/close operations of the switching elements 2 based on the voltage measured by the voltage measurer 20 and the current measured by the current measurer 21, and adjusts the whole resistance value of the load resistors in the discharger 15, thereby adjusting the discharge current.

Next, an explanation will be given of an operation of the battery-condition monitoring device 100 of this embodiment.

Figure 3:
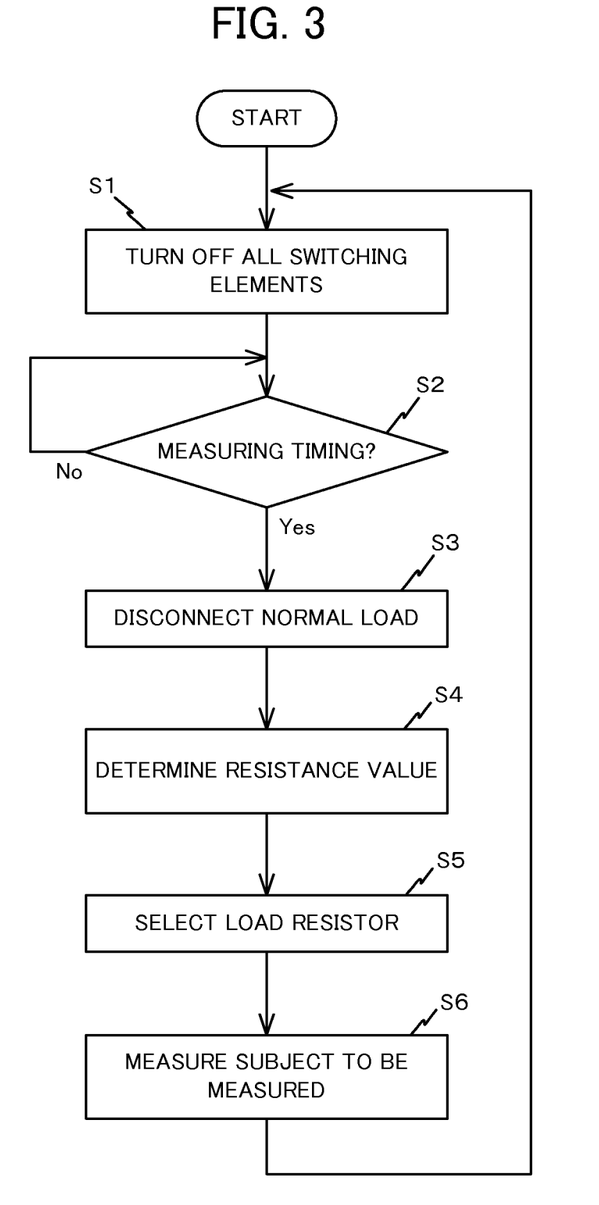
FIG. 3 is a flowchart illustrating operation by the battery-condition monitoring device.

FIG. 3 is a flowchart illustrating operation by the battery-condition monitoring device 100. As illustrated in FIG. 3, in the battery-condition monitoring device 100, the discharge control device 3 turns off all switching elements 2 in the discharger 15 using the selector 23 (step S1). In this way, at the time of, for example, driving a motor, each load resistor 1 is disconnected from the battery 10, and the motor is connected to the battery 10 through an inverter. The battery-condition monitoring device 100 controls a connection between the battery 10 and the motor and the inverter.

In this condition, electric power from the battery 10 is supplied to the motor through the inverter, and when the motor is decelerated, the motor functions as a power generator, and the obtained power regenerates the battery 10. The battery 10 repeats charging/discharging in this way.

Next, the discharge control device 3 waits for a measuring timing (step S2: NO). At the time of measurement (step S2: YES), the discharge control device 3 disconnects normal loads, such as the inverter and the motor, from the battery 10 (step S3).

Subsequently, the discharge control device 3 determines the resistance value through the determiner 22 as explained above (step S4). For example, the determiner 22 divides the voltage value obtained by the voltage measurer 20 by a current value satisfying the predetermined current condition to calculate the resistance value.

Next, the discharge control device 3 selects the load resistor or resistors 1 through the selector 23 as explained above (step S5). Hence, the open/close operations of the respective switching elements 2 are controlled, and the resistance value of the load resistor or resistors 1 connected to the battery 10 becomes the resistance value determined by the determiner 22. At this time, the discharge control device 3 may confirm whether the current measured by the current measurer 21 satisfies the predetermined current condition.

Subsequently, the discharge control device 3 measures subjects to be measured (step S6). For example, the SOC, the internal impedance and the like of the battery 10 are measured. Those subjects to be measured can be determined by various methods. For example, the subjects to be measured can be calculated based on the voltage value measured by the voltage measurer 20 and the current value measured by the current measurer 21.

After the execution of the step S6, the discharge control device 3 returns the process to the step S1. At this time, the discharge control device 3 connects the battery 10 to the normal loads, such as the inverter and the motor.

According to the battery-condition monitoring device 100 of this embodiment, the resistance value of the load resistors 1 is changed to change the magnitude of the discharge current of the battery 10. Hence, even if the internal resistance of the battery becomes high or low due to a temperature environment and/or a history of usage, the battery 10 can be discharged at a necessary current for measurement.

As explained above, according to the battery-condition monitoring device 100 of this embodiment, at least two kinds of load resistors 1 having different resistance values are provided, and thus the subjects to be measured can be measured regardless of a great change in the internal resistance of the battery 10. As a result, the condition of the battery 10 can be monitored smoothly.

In addition, according to the battery-condition monitoring device 100 of this embodiment, even if the battery 10 has greatly different resistance, or if the internal resistance changes greatly due to a temperature and an use environment, a necessary discharge current is set each time, and thus the measurement can be performed smoothly.

As explained above in detail, according to this embodiment, the discharge control device 3 adjusts the resistance value of the load resistors 1 of the discharge circuits. Hence, even if the resistance value of the internal resistance of the battery 10 changes greatly, the resistance value of the load resistors 1 can be changed in accordance with such a change of the internal resistance. As a result, the SOC and the internal impedance of the battery 10 can be measured stably.

Embodiment 2

Next, a second embodiment of the present disclosure will be explained.

Figure 4:
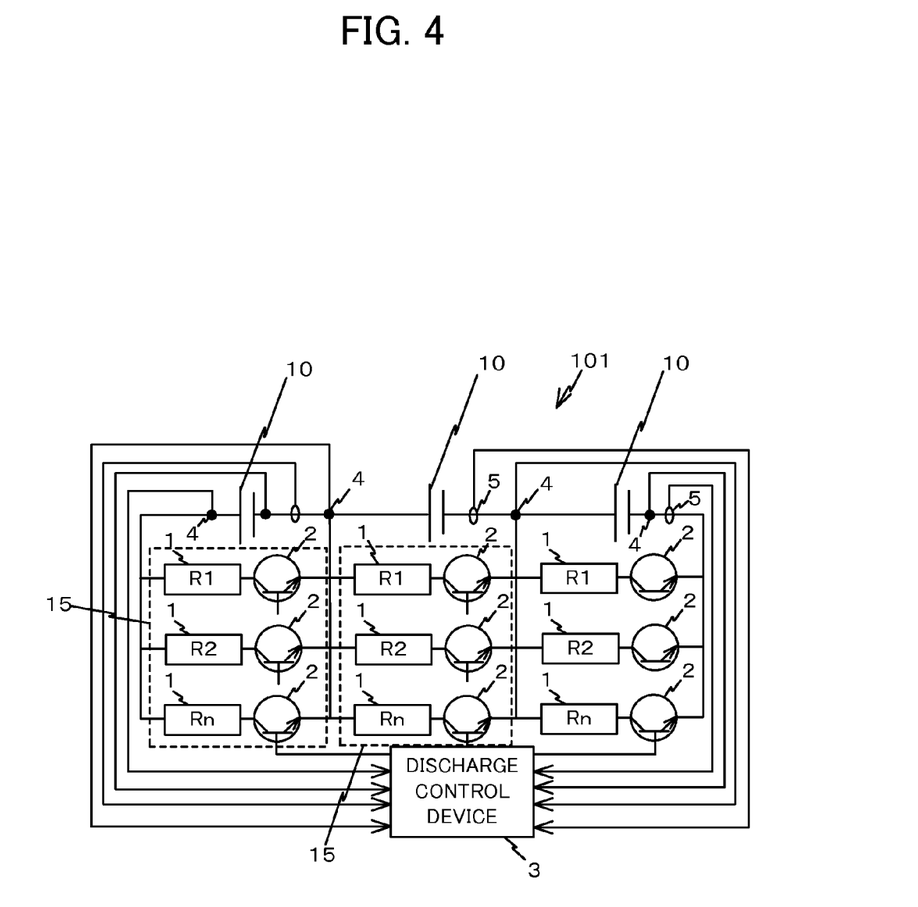
FIG. 4 is a circuit diagram illustrating a general structure of a discharge device for an electricity storage device (available battery capacity equalization device) according to a second embodiment of the present disclosure.

FIG. 4 illustrates a circuit structure of an available battery capacity equalization device 101 that is a discharge device for an electricity storage device according to the second embodiment of the present disclosure. The available battery capacity equalization device 101 is an available capacity equalization device that equalizes a variation in the available capacities (SOC) of the electricity storage device when multiple battery cells are connected in series to construct a high-voltage battery.

As illustrated in FIG. 4, three batteries 10 are connected in series. In this embodiment, the series circuit of the batteries 10 is equivalent to an electricity storage device. Connected to both ends of the series circuit of this electricity storage device are, for example, a drive motor, an inverter and the like for an electric vehicle, a hybrid vehicle, or the like. The discharge control device 3 controls a connection/disconnection between the electricity storage device and the motor and the inverter.

The available battery capacity equalization device 101 includes the discharger 15 for each cell of the battery 10. Like the first embodiment, the discharger 15 is provided with the multiple discharge circuits. Discharge circuits include at least two kinds of load resistors 1 (R1, R2, . . . Rn) having different resistance values, and the switching elements 2 such as transistors. The multiple discharge circuits are connected in parallel with each other.

In addition, the discharge control device 3 measures, for each cell of the battery 10 subjected to discharging, a voltage between the positive electrode and the negative electrode, and a flowing current. Although not illustrated in FIG. 4, in this embodiment, the discharge control device 3 includes the voltage measurer 20 and the current measurer 21 for each cell of the battery 10.

When the connection between the electricity storage device and the motor and the inverter is disconnected, the discharge control device 3 turns on (closes) the switching element or elements 2 corresponding to the cell of the battery 10 as needed to discharge the cell. The discharging time is a time in accordance with a voltage measured by the voltage measurer 20. That is, the higher the voltage value of the cell is, the longer the discharging time is.

At this time, the discharge control device 3 selects the load resistor or resistors 1 among the load resistors 1 having different resistance values based on the value measured by the voltage measurer 20 constructed for each cell and the value measured by the current measurer 21 constructed for each cell. This makes it possible to change the magnitude of the discharge current of the electricity storage device.

Hence, even if the internal resistance of the battery becomes high or low due to the temperature environment and/or the history of usage, the respective cells of the batteries 10 can be discharged at a necessary current for equalization.

When the deactivation time of the electricity storage device becomes shorter than a threshold or when the non-uniformity of the voltage values becomes greater than a threshold, by increasing the resistance value of the load resistors 1 corresponding to the cell of the battery 10 with a high voltage, the battery 10 can be discharged with a necessary current for equalization of the available capacities of the batteries 10.

As explained above, by selecting an optimal load resistor or optimal load resistors 1 among at least two kinds of load resistors 1 having different resistance values for each cell, the equalization of the available capacities of the batteries 10 can be performed smoothly regardless of a change in the internal resistance of the battery and the like. Hence, the electricity storage device can be smoothly activated.

As explained above in detail, according to this embodiment, the discharge control device 3 changes the resistance value of the load resistors 1 of the discharge circuits. Hence, even if the resistance value of the internal resistance of the battery 10 changes greatly, the resistance value of the load resistors 1 can be changed in accordance with such a change. As a result, the available capacities of the electricity storage device having the multiple batteries 10 connected can be equalized stably.

Embodiment 3

Next, a third embodiment of the present disclosure will be explained.

Figure 5:
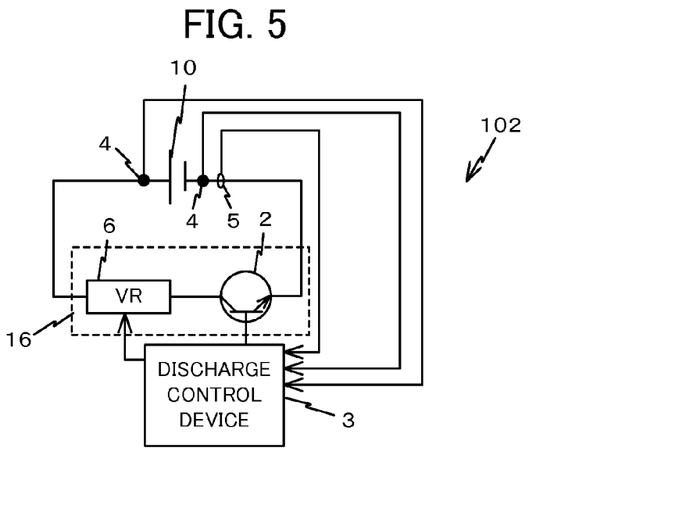
FIG. 5 is a circuit diagram illustrating a general structure of a discharge device for an electricity storage device (battery-condition monitoring device) according to a third embodiment of the present disclosure.

FIG. 5 illustrates a circuit structure of a battery-condition monitoring device 102 that is a discharge device for an electricity storage device according to the third embodiment of the present disclosure. As illustrated in FIG. 5, in this embodiment, the structure of a discharger 16 is different from that of the first embodiment.

In this embodiment, the discharge circuit of the discharger 16 is a series circuit of a variable resistor 6 and the switching element 2. In addition, only one discharge circuit is provided.

The discharge control device 3 changes the resistance value of the variable resistor 6.

More specifically, the discharge control device 3 determines the necessary resistance value of the variable resistor 6 based on the value measured by the voltage measurer 20 and the value measured by the current measurer 21, and adjusts the resistance value of the variable resistor 6. The method of determination of the resistance value is the same as for the first and second embodiments. This makes it possible to change the magnitude of the discharge current of the electricity storage device. As a result, in accordance with the internal resistance of the battery becoming high or low due to the temperature environment and the history of usage, the electricity storage device can be discharged at a necessary current for measurement.

By providing the variable resistor 6 in this way, regardless of the change in the internal resistance of the battery 10, the internal resistance can be measured smoothly. As a result, the condition of the electricity storage device can be smoothly monitored.

In addition, according to the above-explained structure, the circuit structure of the battery-condition monitoring device 102 can be simplified. As a result, the circuit board can be downsized, thereby downsizing the whole device.

Embodiment 4

Next, a fourth embodiment of the present disclosure will be explained.

Figure 6:
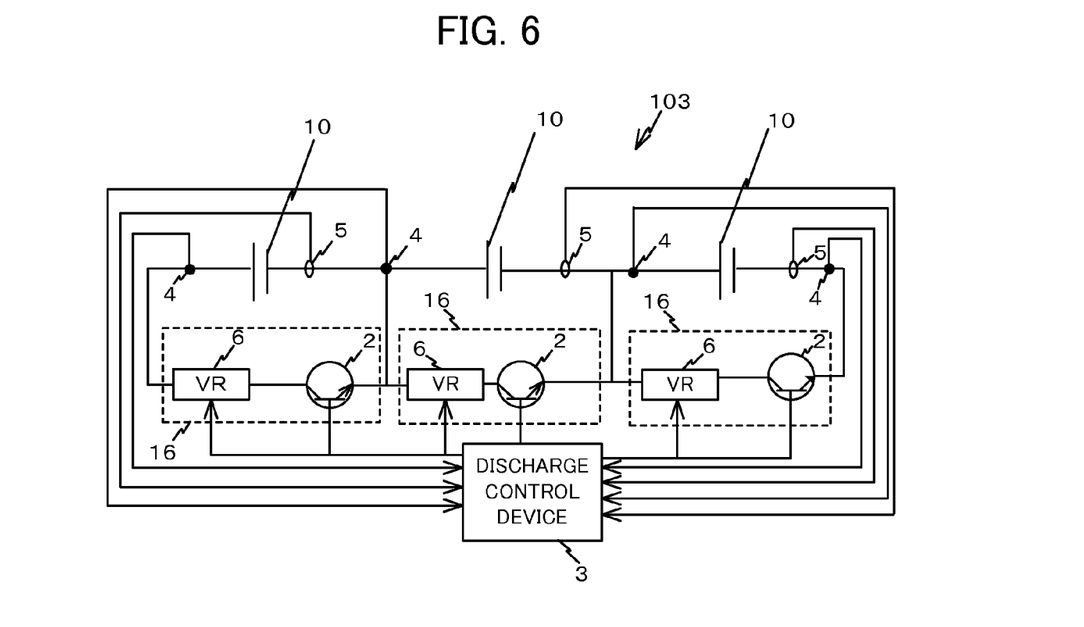
FIG. 6 is a circuit diagram illustrating a general structure of a discharge device for an electricity storage device (available battery capacity equalization device) according to a fourth embodiment of the present disclosure.

FIG. 6 illustrates a circuit structure of an available battery capacity equalization device 103 that is a discharge device for an electricity storage device according to the fourth embodiment of the present disclosure. The available battery capacity equalization device 103 is an available capacity equalization device that equalizes variation in the available capacities (SOC) of the electricity storage device when multiple cells of batteries 10 are connected in series to construct a high-voltage battery. As illustrated in FIG. 6, according to this available battery capacity equalization device 103, the difference from the second embodiment is that the discharger 16 is provided instead of the discharger 15.

As explained above, the discharge circuit of the discharger 16 is a series circuit of the variable resistor 6 and the switching element 2. Only one discharge circuit is provided for each cell of the battery 10.

The discharge control device 3 adjusts the resistance value of the load resistor 1 that is a variable resistor.

More specifically, the discharge control device 3 adjusts the resistance value of the variable resistor 6 based on the value measured by the voltage measurer 20 constructed for each cell of the battery 10 and the value measured by the current measurer 21 constructed for each cell of the battery 10. This makes it possible to change the magnitude of the discharge current of the electricity storage device. Hence, even if the internal resistance of the battery becomes high or low due to the temperature environment and/or the history of usage, the cell of the battery 10 can be discharged at a necessary current for discharging and equalization. In addition, even if a necessary time for equalization of the available battery capacities becomes quite short or the amount of heat generation through discharging becomes great beyond the allowable range, sufficient discharging is enabled.

By providing the variable resistor 6 for each cell of the battery 10 in this way, regardless of a great change in the internal resistance and the like of the battery 10, the available capacities of the batteries 10 can be equalized smoothly. Hence, the electricity storage device can be smoothly activated.

In addition, according to the above-explained structure, the circuit structure of the available battery capacity equalization device 103 can be simplified. As a result, the circuit board can be downsized, thereby downsizing the whole device.

When the above-explained battery-condition monitoring devices 100, 102 are utilized, it is possible to check a temporal characteristic change like a memory effect, when the battery 10 is a nickel-metal hydride battery, based on a resistance value dominated by internal mass transfer. Still further, it becomes possible to determine whether there has been a non-recoverable deterioration of characteristics.

A temperature measurer that measures the temperature of the battery 10 can be additionally provided. Next, based on the temperature measured by the temperature measurer, the selection of the load resistor 1 and/or the adjustment of the resistance value of the variable resistor 6 can be performed.

INDUSTRIAL APPLICABILITY

The present disclosure is suitable for measuring the condition (SOC and/or internal impedance) of an electricity storage device. In addition, the present disclosure is suitable for equalizing, when multiple secondary batteries are connected in series, the available capacities of the respective secondary batteries in an electricity storage device. Hence, the present disclosure is suitable for all electric drive devices using an electricity storage device such as an electric vehicle.

REFERENCE SIGNS LIST

1 Load resistor
2 Switching element
3 Discharge control device
4 Terminal
5 Ammeter
6 Variable resistor
10 Battery
15, 16 Discharger
20 Voltage measurer
21 Current measurer
22 Determiner
23 Selector
100 Battery-condition monitoring device
101 Available battery capacity equalization device
102 Battery-condition monitoring device
103 Available battery capacity equalization device

The invention claimed is:

1. A discharge device for an electricity storage device that, by flowing a discharge current through a load resistor connected between a positive electrode of an electricity storage device and a negative electrode thereof, discharges the electricity storage device and measures a condition of the electricity storage device, the discharge device comprising:
   a discharger capable of switching a resistance value of the load resistor; and
   a controller that, based on a voltage of the electricity storage device, adjusts the discharge current by switching the resistance value of the load resistor;
   wherein the controller comprises a voltage measurer that measures a voltage between the positive electrode of the electricity storage device and the negative electrode thereof, and based on the voltage measured by the voltage measurer, determines the resistance value of the load resistor and automatically performs switching such that a current flows such that a polarization value in a polarization curve of the electricity storage device becomes greater than a certain value.

2. The discharge device for an electricity storage device according to claim 1, wherein:
   the discharger comprises a plurality of discharge circuits, each discharge circuit comprising a respective switch and a respective load resistor connected in series between the positive electrode of the electricity storage device and the negative electrode thereof, wherein the resistance value of each of the load resistors is different; and
   the controller adjusts the resistance value of the load resistors through an open/close operation of the switch of each of the plurality of discharge circuits.

3. The discharge device for an electricity storage device according to claim 1, wherein:
   the load resistor is a variable resistor; and
   the controller adjusts the resistance value of the load resistor.

4. The discharge device for an electricity storage device according to claim 1, wherein:

the controller further comprises a current measurer that measures a current flowing from the electricity storage device; and the controller confirms whether the current measured by the current measurer satisfies a predetermined current condition.

5. The discharge device for an electricity storage device according to claim 2, wherein:
the controller further comprises a current measurer that measures a current flowing from the electricity storage device; and the controller confirms whether the current measured by the current measurer satisfies a predetermined current condition.

6. The discharge device for an electricity storage device according to claim 3, wherein:
the controller further comprises a current measurer that measures a current flowing from the electricity storage device; and the controller confirms whether the current measured by the current measurer satisfies a predetermined current condition.

* * * * *